United States Patent [19]

Linscott, Jr.

[11] 4,176,242
[45] Nov. 27, 1979

[54] DIODE HOUSING

[75] Inventor: Phillip S. Linscott, Jr., Rockford, Ill.

[73] Assignee: Sundstrand Corporation, Rockford, Ill.

[21] Appl. No.: 869,754

[22] Filed: Jan. 16, 1978

[51] Int. Cl.² ............................................. H05K 5/06
[52] U.S. Cl. ............................ 174/52 H; 310/68 D; 357/74
[58] Field of Search .................. 174/52 H; 357/74; 310/68 D

[56] References Cited

U.S. PATENT DOCUMENTS 3,274,456  9/1966  Pittler et al. ................ 174/52 H X Primary Examiner—Roy N. Envall, Jr.
Assistant Examiner—D. A. Tone
Attorney, Agent, or Firm—Wegner, Stellman, McCord, Wiles & Wood

[57] ABSTRACT

A diode mountable on the rotor shaft of an electrical machine, such as a generator, with an insulating member between the stem and body of the diode having a strength sufficient to resist bending moment on the stem of the diode resulting from centrifugal force and prevent fracture of the insulating member.

1 Claim, 2 Drawing Figures

DIODE HOUSING

BACKGROUND OF THE INVENTION

This invention relates to a diode structure having the parts thereof selected and dimensioned to prevent mechanical failure when the diode is subject to centrifugal forces.

AC generators used in aircraft have diodes to rectify the three-phase AC output of the exciter armature to DC for input into the main field. Generally, either three diodes or six diodes are mounted on the rotor shaft to provide the half wave or full wave rectification. The diodes can be positioned in several different arrangements, namely: an axial arrangement where the centerline of the diodes is parallel to and radially outward from the centerline of the rotor shaft; a perpendicular arrangement where the centerline of the diodes is at right angles to and radially outward of the centerline of the rotor shaft; and an angular arrangement where the centerline of the diodes is somewhere between parallel to and perpendicular to the centerline of the rotor shaft. The first-mentioned axial arrangement generally results in a smaller, lighter package and, therefore, is a desirable and frequently required mounting arrangement.

The great disadvantage of the axial arrangement is that a bending moment is applied to the stem of the diode resulting from the centrifugal force generated on the diode stem due to the mass of the stem itself, the lead wire and attaching mechanisms required to electrically connect the diode to either the exciter armature or main field. The diode stem must be electrically insulated from the base of the diode and this is commonly done by providing a disc of a glass-type composition between the base and the stem. The insulating member must have an expansion rate which closely approximates the expansion rate of the stem and base to enable the diode to perform throughout its temperature range without leaking or overstressing the insulating member.

Most of the aircraft generators in service today with diodes axially arranged have experienced mechanical failure from fracture of the insulating glass member which allows contaminants to enter the previously hermetically-sealed junction area resulting in diode shorting. In spray oil-cooled machines, the contaminant is the oil, itself. It is believed that this failure results from the bending moment applied to the diode stem resulting from centrifugal force and which reacts on the glass insulating member and causes the glass to fracture.

SUMMARY OF THE INVENTION

A primary feature of the invention disclosed herein is to provide a diode which will take into account the forces encountered during use thereof and which provides dimensioning of the diode parts to limit the stress on the insulating member to a value which will prevent fracture and failure thereof.

A primary object of the invention is to provide a diode usable in centrifugally-loaded applications wherein the diode parts are dimensioned by use of stress analysis to result in a structure which will not fail mechanically.

Another object of the invention is to provide a diode as defined in the preceding paragraph wherein an insulating member in the form of a disc of glass-type composition has a thickness selected to resist fracture and in relation to the diameter of the diode stem and the bending moment applied to the stem by the centrifugal force resulting from rotation of a mass supported by the stem and including the unsupported length of the stem itself.

Still another object of the invention is to provide a diode as defined in the preceding paragraphs wherein the minimum thickness of the insulating disc is inversely related to the diameter of the diode stem and directly related to the factors which contribute to the bending moment from the centrifugal force including the weight of the stem and parts supported thereby, the maximum rotational speed of the rotatable body carrying the diode, the radial distance from the centerline of the rotatable body to the centerline of the stem and the axial length of the stem from the insulating disc to the centerline of the mounting of the parts supported by the diode stem.

DESCRIPTION OF THE PREFERRED EMBODIMENT

Figure 1:
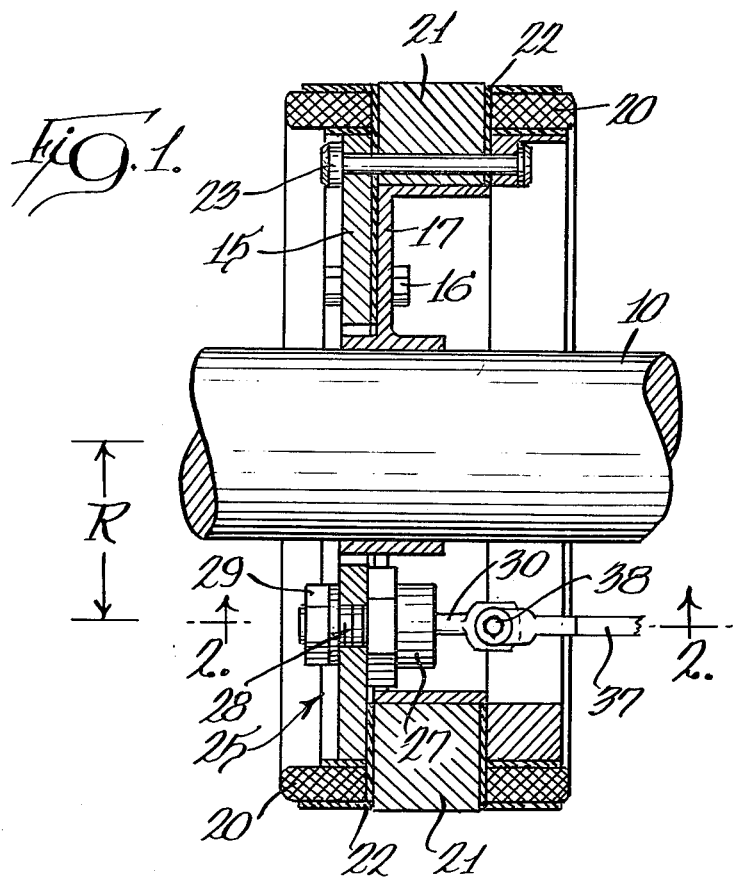
FIG. 1 is a vertical section of a part of a generator carrying an axially-arranged diode and with a dimensional relation between parts thereof indicated by a suitable legend.

A part of a dynamo-electric machine such as an AC generator is shown in FIG. 1 including a rotatable body in the form of a rotor shaft 10 which is mountable in a casing by suitable bearing means (not shown) and which is connectable to a power source for causing rotation thereof.

An annular mounting plate 15 rotates with the shaft 10 by connection by attaching means 16 to a sleeve member 17 secured to the shaft. The plate 15 and sleeve member 17 carry structure of the generator including a coil 20 with an intermediate annular member 21 and with separators 22 therebetween, with the structure being held together by tie members 23.

The structure of the generator forms no part of the present invention and is merely for illustrative purposes with respect to mounting of a diode, indicated generally at 25. The diode has a body 26 with an annular base 27 extending to one side of the body and a threaded cylindrical mounting member 28 extending from the other side thereof. The mounting member 28 extends through an opening in the annular mounting plate 15 and has a threaded member 29 attached thereto to lock the diode in position on the mounting plate.

Although a single diode is shown in FIG. 1, it will be recognized that generally at least three or six diodes are mounted on the annular mounting plate 15 for the purpose of providing half wave or full wave rectification of the output of the exciter armature for input into the main field of the generator.

The illustrated diode 25 is shown mounted in an axial arrangement wherein the centerline of the diode 25 is in axially parallel relation with the rotor shaft 10. More specifically, the diode is parallel to and radially outward from the centerline of the rotor shaft 10. This orientation of the diode results in a smaller, lighter package than a diode arrangement wherein the diode might extend perpendicular to the rotor shaft 10 or be in an angular relation wherein the diode extends in a direction between being parallel and perpendicular to the rotor shaft.

The diode has a tubular stem 30 mounted with respect to the annular base 27 by a disc 31 of insulating material therebetween which, in the preferred form, is a glass-type composition, such as the glass originally developed for television picture tubes and which has a thermal expansion rate closely approximating that of the diode stem which passes through the glass. An example of such material is Corning 9010 glass. With a thermal expansion rate which closely approximates that of the diode stem as well as the base 27, the diode is able to perform throughout its temperature range without leaking or overstressing the disc 31. An electrical connection member 35 is positioned within the diode stem 30 and extends to a connection point within the diode.

The diode stem 30 is generally cylindrical in the mounting area at the disc 31 and for a distance outwardly therefrom and is flattened and formed with a mounting hole 36 for an electrical lead 37 which is attached to the diode stem by attaching means including a threaded bolt member 38 and a threaded nut member 39.

With the axially parallel relation of the diode with the rotor shaft 10, the mass of the rotating parts which are supported by the disc 31 result in a centrifugal force providing a bending moment on the stem which must be reacted by the disc 31 during operation of the generator. The dimensional relations of the diode parts are determined whereby a minimum thickness of the disc 31 will assure a safe design for the diode, without fracture of the disc and failure of the diode.

Figure 2:
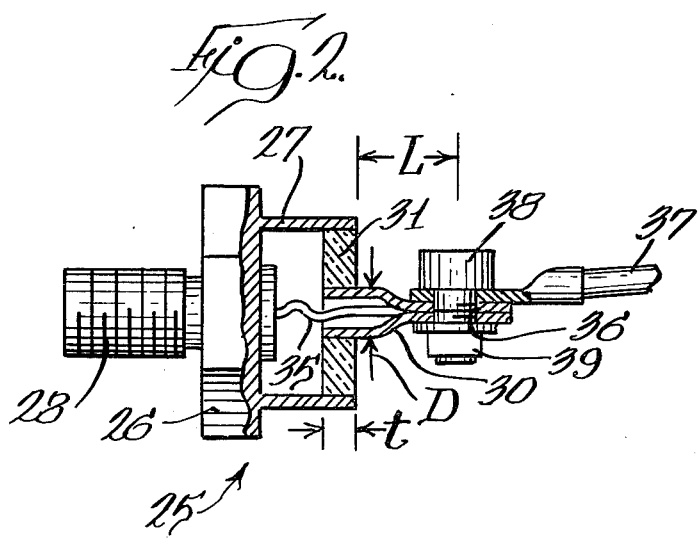
FIG. 2 is a section, on an enlarged scale, taken generally along the line 2—2 in FIG. 1, with parts omitted and having several dimensional relations indicated by suitable legends.

The minimum thickness of the disc is inversely related to a diameter D (FIG. 2) of the tubular diode stem 30. The minimum thickness of the disc is directly related to: the weight of the diode stem 30, plus the weight of the unsupported electrical lead 37 and the attaching means which attaches the lead to the diode stem including the threaded bolt member 38 and the threaded nut 39; the rotational speed of the rotor shaft 10 as well as the radial distance of the centerline of the rotor shaft 10 to the centerline of the diode 25, as indicated by R in FIG. 1; and the axial length L of the exposed diode stem 30 from the outer face of the disc 31 to the centerline of the mounting hole 36 in the diode stem.

More particularly, a limit is placed on the stress on the disc 31 by inputting the variables mentioned above into an equation and adjusting such variables to produce a diode which will limit the stress on the disc 31 to a predetermined maximum.

It has been found that the following equation will provide a safe design for the diode when mounted in an axial arrangement at the distance R from the centerline of rotation of the rotor shaft 10:

$$t_{min} = 6.886 \times 10^{-8} \times W \times N^2 \times R \times L^{1/2}/D$$

Wherein, $t_{min}$ = the minimum thickness in inches of the disc 31 required to prevent failure;

W equals the weight of the diode stem 30 plus the weight of the unsupported lead 37 and the attaching means therefor in grams;

N equals the maximum rotational speed of the rotor shaft 10 in revolutions per second;

R equals the radial distance from the centerline of the rotor shaft 10 to the centerline of the diode 25 in inches;

L equals the axial length of the diode stem from the outer face of the disc 31 to the centerline of the mounting hole 36 in inches; and D equals the diameter of the stem 30 in inches.

With the equation disclosed above, the minimum thickness of the disc 31 can be selected with the other variables known or if the disc has a certain thickness other of the variables may be varied to satisfy the equation.

I claim:

1. A dynamo-electric machine comprising, in combination, a rotatable shaft with a maximum rotational speed and having a mounting member extending radially thereof, a diode having a body and a stem extending therefrom with a disc of glass-type insulating material positioned therebetween, a mounting member extending from said diode body in a direction opposite from said stem and connected to said mounting member to have said diode in axially parallel relation with said shaft, an electrical lead connected to the stem at a mounting hole in the stem by attaching means, and said disc having a thickness to prevent fracture by a bending moment imparted to the stem resulting from centrifugal force of the stem and connected structure, and said thickness having a minimum value of t min in inches, in the equation:

$$t_{min} = 6.886 \times 10^{-8} \times W \times N^2 \times R \times L^{1/2}/D$$

wherein

W = weight of the stem and parts supported thereby measured in grams;

N = maximum rotational speed of the rotatable shaft in revolutions per second;

R = radial distance from centerline of the rotatable shaft to the centerline of the stem in inches;

L = axial length of stem from an exposed face of the disc to the centerline of the mounting hole in inches; and D = diameter of stem in inches.

* * * * *